United States Patent
Gellrich et al.

(10) Patent No.: US 6,569,773 B1
(45) Date of Patent: May 27, 2003

(54) METHOD FOR ANISOTROPIC PLASMA-CHEMICAL DRY ETCHING OF SILICON NITRIDE LAYERS USING A GAS MIXTURE CONTAINING FLUORINE

(75) Inventors: Norbert Gellrich, Massenbachhausen (DE); Rainer Kirchmann, Neckarsulm (DE)

(73) Assignee: TEMIC Semiconductor GmbH, Heilbronn (DE)

(*) Notice: Subject to any disclaimer, the term of this patent is extended or adjusted under 35 U.S.C. 154(b) by 0 days.

(21) Appl. No.: 09/459,284

(22) Filed: Dec. 17, 1999

(30) Foreign Application Priority Data

Dec. 24, 1998 (DE) .......................... 198 60 271
Nov. 17, 1999 (DE) .......................... 199 55 145

(51) Int. Cl.$^7$ ............................. H01L 21/302
(52) U.S. Cl. ................. 438/706; 438/710; 438/711; 438/713; 438/723; 438/724
(58) Field of Search ................ 438/706, 710, 438/723, 724, 711, 713

(56) References Cited

U.S. PATENT DOCUMENTS

| | | | | |
|---|---|---|---|---|
| 4,687,543 A | * | 8/1987 | Bowker ...................... 156/643 |
| 4,844,733 A | * | 7/1989 | Loewenstein et al. ...... 156/643 |
| 4,844,773 A | * | 7/1989 | Loewenstein et al. ...... 156/643 |
| 4,857,140 A | * | 8/1989 | Loewenstein ............... 156/643 |
| 5,013,398 A | * | 5/1991 | Long et al. .................. 156/643 |
| 5,200,357 A | * | 4/1993 | Collot ........................ 437/180 |
| 5,433,823 A | * | 7/1995 | Cain ........................ 156/662.1 |
| 5,834,369 A | * | 11/1998 | Murakami et al. ........... 438/625 |
| 5,854,136 A | * | 12/1998 | Huang et al. ............... 438/714 |
| 6,100,183 A | * | 8/2000 | Lu et al. ...................... 438/637 |
| 6,107,208 A | * | 8/2000 | Cheng et al. ................ 438/724 |
| 6,194,323 B1 | * | 2/2001 | Downey et al. ............. 438/717 |
| 6,291,356 B1 | * | 9/2001 | Ionov et al. ................. 438/710 |

FOREIGN PATENT DOCUMENTS

| | | | |
|---|---|---|---|
| DE | 3318566 | * | 11/1983 |
| DE | 3714144 | * | 12/1987 |
| DE | 4232475 | * | 3/1994 |
| EP | 0516053 | * | 12/1992 |
| EP | 0706206 | * | 4/1996 |
| JP | 02012915 | * | 1/1990 |
| JP | 05251399 | * | 9/1993 |
| WO | WO 96/16433 | * | 5/1996 |
| WO | WO 96/16437 | * | 5/1996 |

OTHER PUBLICATIONS

Article entitled "Rapid plasma etching of silicon, silicon dioxide and silicon nitride using microwave discharges", by S.K. Ray et al.; Semicond.Sci. Technol.8 (1993) 599–604, Printed in the UK.

* cited by examiner

*Primary Examiner*—Robert Kunemund
*Assistant Examiner*—Charlotte A. Brown
(74) *Attorney, Agent, or Firm*—W. F. Fasse; W. G. Fasse (57) ABSTRACT

An etching gas mixture containing $CHF_3$, $SF_6$ and a non-oxidizing gas such as Ar is used as an etching gas mixture for the anisotropic plasma-chemical dry-etching of a silicon nitride layer differentially or selectively relative to a silicon oxide layer. The gas mixture does not contain oxygen, chlorine, bromine, iodine or halides in addition to the above mentioned constituents, so that the process can be carried out in reactor systems equipped with oxidizable electrodes. By adjusting the gas flow rates or composition ratios of $CHF_3$, $SF_6$, and argon in the etching gas mixture, it is possible to adjust the resulting etching selectivity of silicon nitride relative to silicon oxide, and the particular edge slope angle of the etched edge of the remaining silicon nitride layer. A high etch rate for the silicon nitride is simultaneously achieved.

30 Claims, 4 Drawing Sheets

METHOD FOR ANISOTROPIC PLASMA-CHEMICAL DRY ETCHING OF SILICON NITRIDE LAYERS USING A GAS MIXTURE CONTAINING FLUORINE

PRIORITY CLAIM

This application is based on and claims the priorities under 35 U.S.C. §119 of German Patent Application 198 60 271.5, filed on Dec. 24, 1998, and German Patent Application 199 55 145.6, filed on Nov. 17, 1999, the entire disclosures of which are incorporated herein by reference.

FIELD OF THE INVENTION

The invention relates to a method for carrying out anisotropic plasma-chemical dry etching of silicon nitride layers using an etching gas mixture particularly containing $SF_6$ and $CHF_3$.

BACKGROUND INFORMATION

Various techniques of plasma-chemical dry etching, such as reactive ion etching (RIE) for example, are well known and are typically used in the fabrication of semiconductor circuit elements. An advantage of such dry etching techniques in comparison to wet etching techniques is that structures having dimensions of less than 1 $\mu$m can be produced using dry etching but not by using wet etching. This is necessary, for example, for fabricating integrated circuit elements with SiGe transistors.

U. S. Pat. No. 5,433,823 (Cain) discloses a method of carrying out so-called pad window etching using a gas mixture of $SF_6$ and $CHF_3$, among other gas mixtures. Especially, the mole ratio of $CHF_3$ relative to $SF_6$ is in the range from about 5/1 to about 20/1. The gas flow rates used in the process are a $CHF_3$ flow rate of 180 sccm (standard cubic centimeters per minute) and an $SF_6$ gas flow rate of 20 sccm. The disclosed conventional method is used for etching a passivating semiconductor layer sequence or stack including a layer of $Si_3N_4$ having a thickness of approximately 1 $\mu$m and an underlying layer of $SiO_2$ having a thickness of approximately 0.5 $\mu$m. Both the $Si_3N_4$ and the $SiO_2$ are etched relative to a metal layer of TiW arranged lying under the two semiconductor layers, so as to entirely remove both the $Si_3N_4$ and the $SiO_2$ at a specified window location. The structural dimensions to be etched by the conventional method are in a range around 100 $\mu$m.

Table 3 in column 9 of U.S. Pat. No. 5,433,823 shows the etching selectivities of the etching of the silicon nitride layer relative to the resist material, and of the silicon oxide layer relative to the resist material, when using a conventional $SF_6$ etching gas in one case (the left data column of Table 3) and when using the disclosed mixture of $SF_6$ and $CHF_3$ etching gas in another case (the right data column of Table 3). While the patent points out that the etching selectivity of the silicon nitride relative to the resist and of the silicon oxide relative to the resist, respectively, is improved by using the gas mixture of $SF_6$ and $CHF_3$, a significant disadvantage is also apparent from the data shown in Table 3.

Namely, while the $SF_6$ etching gas achieves a selectivity of 1.6 when considering the silicon nitride relative to the silicon oxide (1.6/1.0=1.6), the disclosed mixture of $SF_6$ and $CHF_3$ achieves a selectivity of only 0.83 for etching silicon nitride relative to silicon oxide (3.3/4.0=0.825). Thus, U.S. Pat. No. 5,433,823 suggests that the addition of $CHF_3$ to $SF_6$ in an etching gas mixture reduces the etching selectivity of silicon nitride relative to silicon oxide from 1.6 to 0.83. While that may not be significant in the context of the patent, wherein a silicon nitride layer and a silicon oxide layer are both to be etched selectively relative to a resist layer and a metal underlayer, it is a disadvantage in any application in which a silicon nitride layer is to be etched selectively relative to a silicon oxide layer.

In various conventionally known etching methods, $CF_4$, $CHF_3$ or other fluorine-containing gases or gas mixtures are typically used in combination with $O_2$ as disclosed in International Patent Publication WO 96/16437. Published European Patent Application EP 0,706,206 similarly discloses an etching process in which a mixture of $CF_4+O_2$ is utilized. In all dry etching processes using $O_2$ as a component of the etching gas mixture, there arises the substantial disadvantage that such processes, i.e. such gas mixtures, cannot be used in the reactor chambers of dry etching systems that use oxidizing or oxidizable electrode materials such as silicon or carbon, because such electrode materials would be attacked and corroded due to the effects of the oxygen component of the gas.

Another type of process is disclosed in German Patent 37 14 144, for example. This German Patent suggests to use a fluorine-containing gas together with chlorine or bromine as a gas mixture. Since these gases, or gas components, are corrosive and toxic, they are not suitable for use in all reactors.

German Patent Laying-Open Document 42 32 475 discloses a plasma-chemical dry etching process for selectively etching silicon nitride layers relative to silicon oxide layers. The etching gas or etching gases used in the disclosed process contain compounds in which respectively one fluorine atom and at least one atom selected from the group consisting of chlorine, bromine and iodine are chemically bonded onto a hydrocarbon framework in the molecular structure. Due to the corrosiveness and toxicity of the gas or its components, such an etching gas is also not suitable or acceptable in all applications.

International Patent Publication WO 96/16433 discloses an anisotropic and selective dry etching process for silicon nitride over thin silicon oxide layers, in which only $Cl_2$ is used as the etching gas. This leads to very low etching rates, which are not practically applicable for etching relatively thick layers, or any layer other than the very thinnest layers.

Published European Patent Application EP 0,516,053 discloses a process in which a mixture of $S_2F_2$, $SF_2$, $SF_4$ or $S_2F_{10}$ with an inert gas is used as the etching gas, especially in order to etch $SiO_2$ selectively relative to $Si_3N_4$. The reference discloses that the sulfur that is freed or released during the etching process is redeposited as a passivating layer on the $Si_3N_4$ surfaces and thereby hinders the etching of the $Si_3N_4$. Through this mechanism, the $SiO_2$ may be selectively and preferentially etched in comparison to the $Si_3N_4$.

In the context of the above discussed conventional etching processes, and in addition to the above mentioned disadvantages of the prior art when using oxygen and halides especially containing $Cl_2$ and Br, studies and experiments conducted by the present inventors have shown that all previously known processes are unable to achieve an adequate or satisfactory control of the edge slope angle of the etched edge of the silicon nitride material. Namely, the resulting slope angle of an edge of an opening or etched-away area of the silicon nitride layer, which is exposed by a corresponding opening in a resist layer or mask, is variable and not readily controllable using the prior art processes.

With the exception of the above mentioned pad window etching process disclosed in U.S. Pat. No. 5,433,823, the other prior art processes described in the literature are used for etching $Si_3N_4$ layers having a thickness of less than about 150 nm. With such thin layers, it is not necessary or critical to achieve a high degree of control of the edge slope angle. If the layer thickness is greater than 150 nm, however, then the resulting edge slope angle does become important. Thus, if the layer thickness of the $Si_3N_4$ material to be etched is greater than 150 nm, or if the edge slope angle serves an important function for the semiconductor component being fabricated, then the prior art processes are not adequate for achieving the required degree of control of the etched edge slope angle.

SUMMARY OF THE INVENTION

In view of the above, it is an object of the invention to provide a method of the above described general type for the plasma-chemical dry etching of silicon nitride layers selectively relative to silicon oxide layers, wherein the edge slope angle of an etched edge of a silicon nitride layer can be precisely set to a required value, while achieving a high etch rate. The invention also aims to avoid the use of corrosive and/or toxic gas components so that the consequent disadvantages can be avoided. Furthermore, the invention aims to avoid or overcome the disadvantages of the prior art, and to achieve additional advantages, as are apparent from the present specification.

The above objects have been achieved according to the invention in a method of carrying out anisotropic plasma-chemical dry etching of a layered arrangement including a second or upper semiconductor layer comprising $Si_3N_4$ arranged on a first or lower semiconductor layer comprising $SiO_2$, using an etching gas mixture that contains $SF_6$, $CHF_3$ and a further non-oxidizing gas. A resist layer or mask layer is arranged on top of the upper semiconductor layer, and the etching is carried out through a patterned opening of the resist layer, whereby the etched edge of the semiconductor layer comprising $Si_3N_4$ is formed at a certain edge slope angle α. Preferably according to the invention, the relative proportions of the gas components in the etching gas mixture and/or other process parameters are adjusted in order to adjust the edge slope angle α of the resulting etched edge and to adjust the selectivity of the etching of the upper semiconductor layer comprising $Si_3N_4$ relative to the lower semiconductor layer comprising $SiO_2$.

Studies and experiments carried out by the present inventors have shown that the inventive mixture of $CHF_3$ and $SF_6$ together with a non-oxidizing gas unexpectedly achieves very good and improved process characteristics and etching results. Particularly, it has been determined that the inventive gas mixture achieves an especially good etching selectivity of silicon nitride relative to silicon oxide while achieving a high etching rate and while simultaneously allowing an adjustment or selection of the resulting edge slope angle of the silicon nitride layer that is to be etched. It appears that the two gases $CHF_3$ and $SF_6$ do not simply act as suppliers or donors of the etching fluorine, but instead it is particularly the mixture or combination of the components of these two gases containing hydrocarbon and sulfur, further in combination with a non-oxidizing gas, that leads to the unexpected new and improved characteristics and results. In this context, the non-oxidizing gas does not simply function as a carrier gas, but instead the non-oxidizing gas represents an active etching component through a reciprocal or mutual interaction with the other gases of the mixture.

An advantage of the presently achieved high silicon nitride etching rates is that relatively thick silicon nitride layers, for example having a layer thickness greater than 200 nm, can be etched with a relatively low process time and thus a high process throughput and economic efficiency, while also carrying out the etching with a defined edge slope angle. A further advantage of the inventive method or process is that a vertical edge slope angle of the silicon nitride layer that is to be etched can be selected or adjusted as needed. In a case in which a vertical etched edge is formed, such an edge can further be provided with a silicon oxide spacer in subsequent process steps, for example.

In the event that a noble inert gas, such as argon for example, is used in the inventive method as the non-oxidizing gas, it is possible to achieve an etching selectivity of silicon nitride relative to silicon oxide of greater than 2, already by adding only a small amount of $CHF_3$ to the $SF_6$ in the gas mixture. The use of argon relative to helium, for example, achieves the additional advantage that a particularly good uniformity of the silicon nitride etch rate over the silicon nitride wafer surface can be achieved, presumably due to the relatively high atomic weight of argon relative to helium. As a result, it is possible to completely and reliably remove all of the silicon nitride layer using a relatively short over-etching time, for example of only 15% or less, or preferably even less than 10% (e.g. 9 or 9.5%) of the total etching time.

By appropriately selecting or adjusting the process parameters of the dry etching process, and particularly the flow rates of the gas mixture, the pressure in the etching reaction chamber of the dry etching system, the plasma generating power of the RF generator, and the electrode gap or spacing, it is possible to select the desired or required resultant edge slope angle of the etched edge within an edge slope angle range of more than 20°. Since the inventive gas mixture contains a non-oxidizing gas instead of the conventionally known use of oxygen and halides added to $SF_6$ and $CHF_3$, the inventive method can be used in reactor chambers equipped with oxidizing or oxidizable electrodes. Particularly, the gas mixture does not contain oxygen, chlorine, bromine, iodine or halides added to the above mentioned constituents.

BRIEF DESCRIPTION OF THE DRAWINGS

In order that the invention may be clearly understood, it will now be described in connection with example embodiments, with reference to the accompanying drawings, wherein.

DETAILED DESCRIPTION OF THE PREFERRED EXAMPLE EMBODIMENTS AND OF THE BEST MODE OF THE INVENTION

Figure 1:
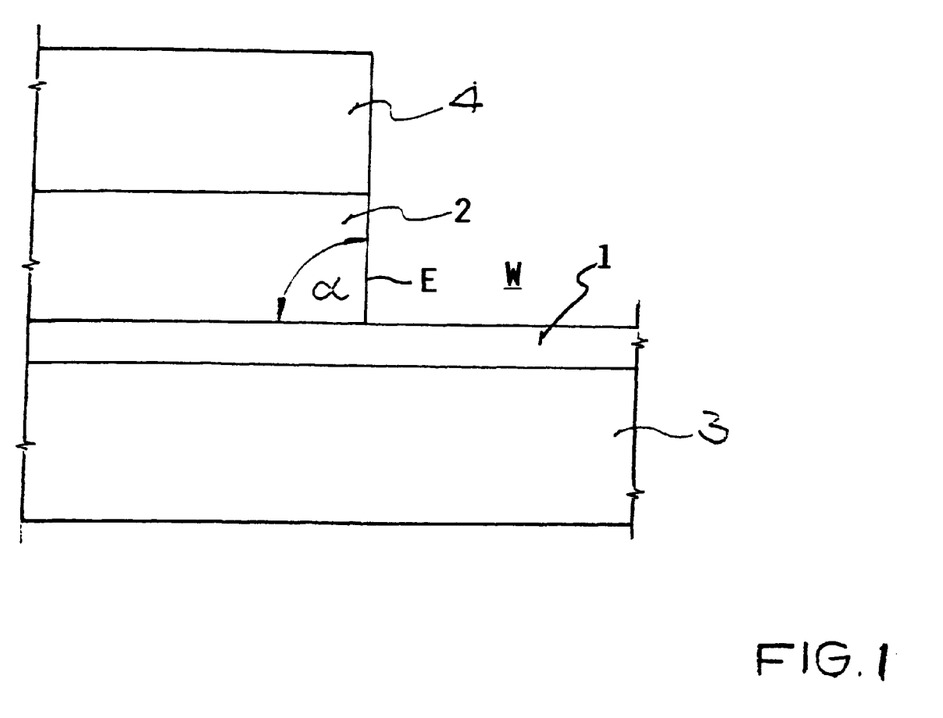
FIG. 1 is a schematic side view of the layered arrangement of semiconductor layers in a state after being etched by an etching process according to the invention.

FIG. 1 schematically shows a side view or a cross-section of a layered semiconductor structure that has already been etched by an etching process according to the invention, to form a window or opening W bounded by an etched edge E, as will be described in detail below. The illustrated semiconductor structure was formed by a process as follows.

In a first step, a first or lower semiconductor layer 1 comprising or preferably essentially consisting of $SiO_2$ was applied on a substrate material 3, for example comprising or essentially consisting of silicon. In the case of using silicon as the substrate material 3, the semiconductor layer 1 of $SiO_2$ can be formed thereon either by thermal oxidation of the silicon of the substrate 3, or by deposition of a silicon oxide layer by a CVD or a PECVD process. The manner in which the various layers in the presently described structure are formed is not a significant feature or limitation of the invention, and can be carried out according to any conventional teachings.

Next, a second or upper semiconductor layer 2 comprising or preferably essentially consisting of $Si_3N_4$ is applied onto the lower semiconductor layer 1. The upper semiconductor layer 2 can be rather thick, for example having a thickness of 400 nm or more. Such a thick silicon nitride layer is, for example, necessary in order to provide a silicon oxide spacer on the resulting etched edge E of the silicon nitride layer 2. The deposition of the silicon nitride layer 2 can be carried out in a vertical deposition system (such as a VTR reactor) or in a CVD/PECVD system, or generally in any conventionally known manner.

In a subsequent process, a resist layer 4 such as a lacquer layer is applied onto the upper semiconductor layer 2 and then patterned or structured by photochemical means in any known manner so as to provide a mask opening or openings at the location or locations at which the etching of the upper semiconductor layer 2 is to be carried out.

Next, the semiconductor structure with the patterned resist layer 4 thereon is placed in a substantially conventional reactive ion etching apparatus, and is then subjected to etching through the opening or openings of the resist layer 4 in order to etch the upper semiconductor layer 2 consisting essentially of silicon nitride, by carrying out the inventive etching process. In this context, a generally conventional dry-etching process such as an RIE process is carried out in any manner known to persons skilled in the art, for example by establishing an etching gas environment in a plasma generating chamber, applying RF power to two spaced electrodes in the chamber so as to generate a plasma of the etching gas and to cause ions of the plasma to impinge on the portion(s) of the semiconductor material exposed through the resist layer to achieve etching of the semiconductor material. During this process, the semiconductor wafer is cooled on its bottom or back surface using helium, so as to hold the wafer at a temperature of about 0° C. during the etching process.

While any conventionally known etching process can be used as the starting point or basis of the inventive process, special features according to the invention must further be provided. Namely, according to the invention, the etching gas mixture that is introduced into the reactive ion etching chamber to generate a plasma and carry out the etching comprises (and preferably consists of) $SF_6$ and $CHF_3$ as well as at least one additional non-oxidizing gas. The non-oxidizing gas is preferably a noble inert gas, for example argon.

Further according to the invention, by appropriately adjusting and selecting the process parameters such as gas pressure, plasma power, and respective gas flow rates or proportional contents of the gas components, it is possible to exactly adjust the resultant edge slope angle α of the etched edge E of the window or opening W etched out of the upper semiconductor layer 2, as well as the etching selectivity, i.e. the ratio of the etching rate of the silicon nitride of the upper layer 2 relative to the etching rate of the silicon oxide of the lower layer 1. The edge slope angle α is defined as the angle through the remaining material of the upper semiconductor layer 2, between the etched edge E and the plane defined by the lower surface of the upper semiconductor layer 2 and the upper surface of the lower semiconductor layer 1.

For etching a silicon nitride layer 2 having a thickness of 400 nm, it is suitable to use a reaction chamber pressure of 450 mTorr, a plasma power of 300 W, an argon flow rate of about 500 sccm, an $SF_6$ flow rate of about 200 sccm and a $CHF_3$ flow rate of about 7 sccm. These process conditions result in an etching selectivity of silicon nitride relative to silicon oxide of about 2, and a substantially perpendicular or 90° edge slope angle α.

The etching apparatus preferably includes an optical end point recognition system which automatically recognizes when the etching has reached a predetermined end point, for example the removal of all of the thickness of the silicon nitride layer 2 and reaching the underlying silicon oxide layer 1, whereupon this system automatically terminates the etching process. In this context, it is important that the over-etching time of etching carried out after the recognition of the end point signal is held short, in order to minimize the unintended etching and reduction of thickness of the underlying silicon oxide layer 1 while still ensuring complete removal of all of the silicon nitride layer 2 at the location of the etched window W. A silicon nitride layer 2 having a thickness of 400 nm, in connection with the etching selectivity of 2 as mentioned above, and the necessary overetching time that must be provided in order to ensure that all of the silicon nitride layer is reliably removed from the etched window area W of the semiconductor wafer, results in the requirement of a silicon oxide layer thickness of at least 40 nm.

Due to the high selectivity, control and uniformity of etching that can be achieved by the invention, it is possible to use low over-etching times, for example even amounting to less than 10% (e.g. 9.5% or less) of the total etching time. It is also possible, in this context, to ensure that at least the majority (and preferably at least 85%) of the original thickness of the silicon oxide layer 1 remains after the complete etching removal of the silicon nitride layer 2 at the window location W has been completed.

FIGS. 2 to 7 are respective diagrams or graphs illustrating the results of a portion of the investigated process parameter ranges, demonstrating the functional dependence or relationship of the edge slope angle α and the etching selectivity with respect to the gas flow rates. In these examples, argon was used as the non-oxidizing gas.

Figure 2:
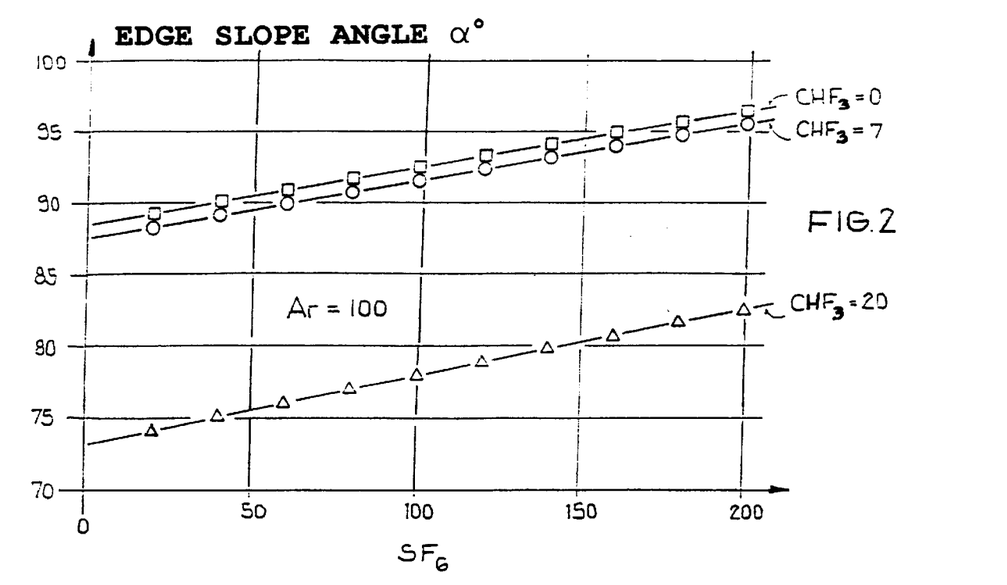
FIG. 2 is a graph showing the resulting edge slope angle of an etched edge as a function of the gas flow rate of $SF_6$, for a fixed argon flow rate of 100 sccm, parametrically showing the results for three different flow rates of $CHF_3$.

FIG. 2 shows that for a relatively low argon flow rate of 100 sccm, the edge slope angle α of an etched edge E increases linearly with an increasing $SF_6$ flow rate of from 20 to 200 sccm, whereby the total variation in the edge slope angle α is more than 7° for a fixed flow rate of $CHF_3$. It is also apparent that an increased flow rate or proportional amount of $CHF_3$ results in a lower or less-steep edge slope angle for each respective flow rate of $SF_6$. By appropriately selecting the combination of an $SF_6$ flow rate and a $CHF_3$ flow rate, it is possible to achieve an edge slope angle at any selected angle in the range from about 74° to about 96°.

Figure 3:
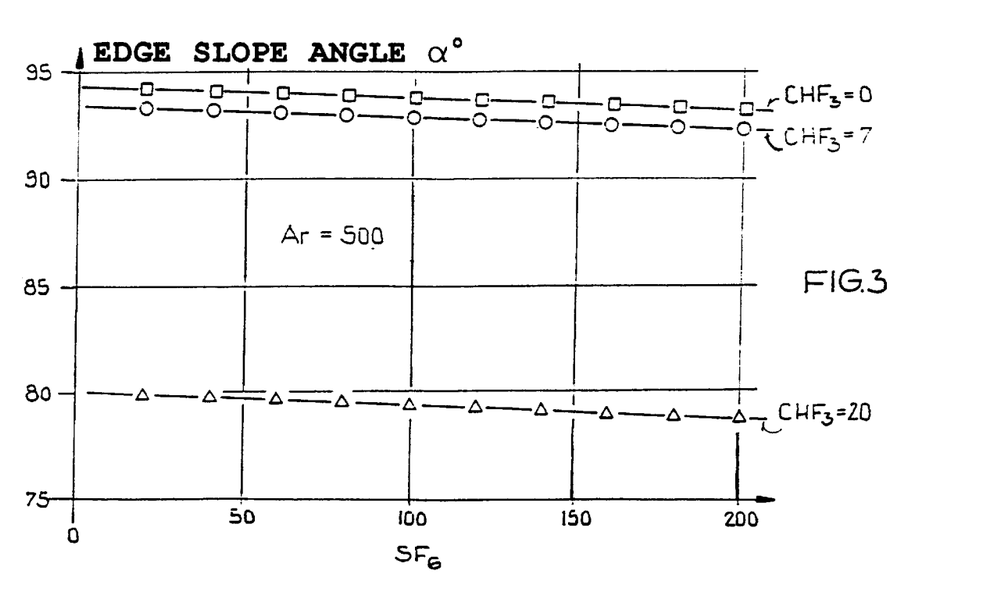
FIG. 3 is a graph similar to that of FIG. 2, but for a fixed argon flow rate of 500 sccm.

In contrast to FIG. 2, it can be seen in FIG. 3 that the edge slope angle actually decreases linearly with the increasing flow rate of $SF_6$ when a relatively high flow rate of Ar at 500 sccm is used. Thus, by comparing the results shown in FIG. 2 for a lower Ar flow rate with the results shown in FIG. 3 for a higher Ar flow rate, it can be seen that the Ar flow rate (and thus the proportional content of Ar in the gas mixture) has a direct substantive effect on the edge slope angle $\alpha$. In other words, the inert Ar gas is not merely a carrier, but actually participates in the etching process.

Figure 4:
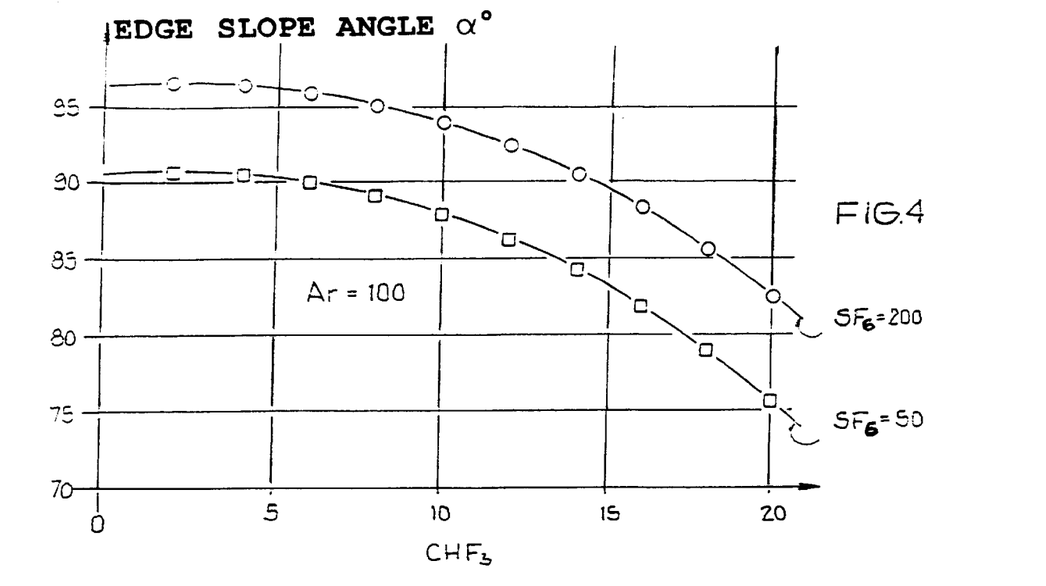
FIG. 4 is a graph showing the resulting edge slope angle of an etched edge as a function of the gas flow rate of $CHF_3$, for a fixed argon flow rate of 100 sccm, parametrically showing the results for two different flow rates of $SF_6$.
Figure 5:
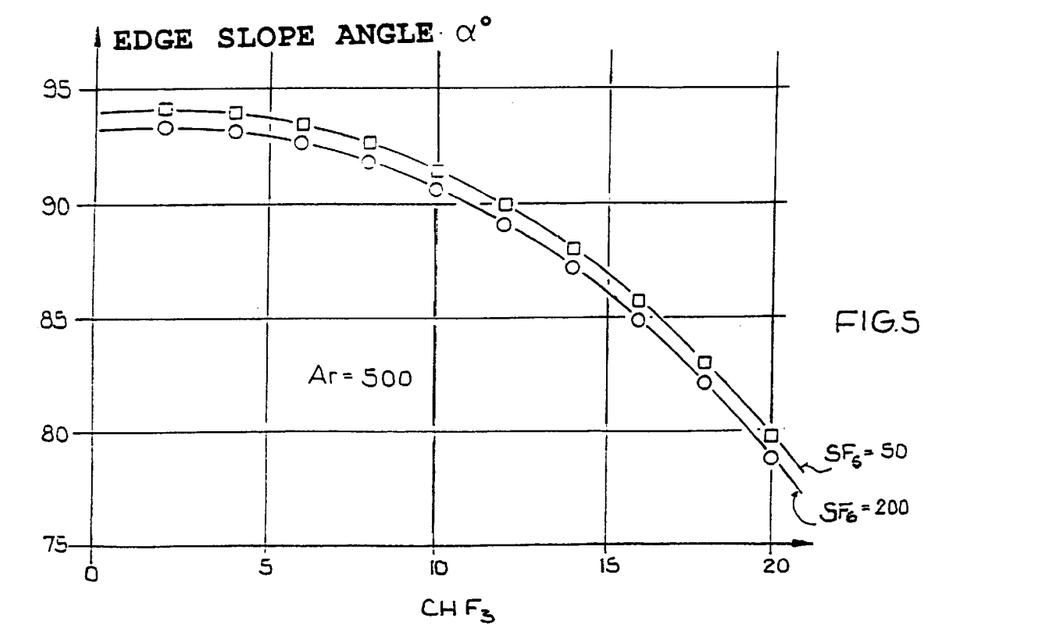
FIG. 5 is a graph similar to that of FIG. 4, but for a fixed argon flow rate of 500 sccm.

FIGS. 4 and 5 show that the edge slope angle $\alpha$ drops off, i.e. tends toward less-steep slope angles, as the flow rate of $CHF_3$ in the etching gas mixture is increased while the $SF_6$ flow rate is set to a constant as shown for two cases. In contrast to the linear relationship between the edge slope angle and the varying $SF_6$ flow rate shown in FIGS. 2 and 3, the dependence between the edge slope angle $\alpha$ and the flow rate of $CHF_3$ is not linear, but rather follows a curve that rapidly drops off at $CHF_3$ flow rates higher than 10 sccm. Thus, whenever perpendicular i.e. 90° edge slope angles of the silicon nitride etched edges are required, it is appropriate to use $CHF_3$ flow rates of about 10 sccm (e.g. in a range from 9 to 12 sccm). In other words, for various argon flow rates as seen by comparing FIGS. 4 and 5, and various $SF_6$ flow rates shown in each of the FIGS. 4 and 5, a range of edge slope angles near 90° is achieved when using a $CHF_3$ flow rate of about 10 sccm.

A comparison of FIGS. 4 and 5 further shows that the increasing Ar flow rate does not reverse the trend of variation of the edge slope angle relative to the variation of $CHF_3$ (as was the case relative to the variation of $SF_6$ as shown in FIGS. 2 and 3). Instead, increasing the Ar flow rate from 100 sccm to 500 sccm has the effect of increasing the edge slope angle at each respective $CHF_3$ flow rate for relatively low $SF_6$ flow rates such as 50 sccm, but decreasing the edge slope angle for each respective $CHF_3$ flow rate in combination with relatively high $SF_6$ flow rates such as 200 sccm.

Figure 6:
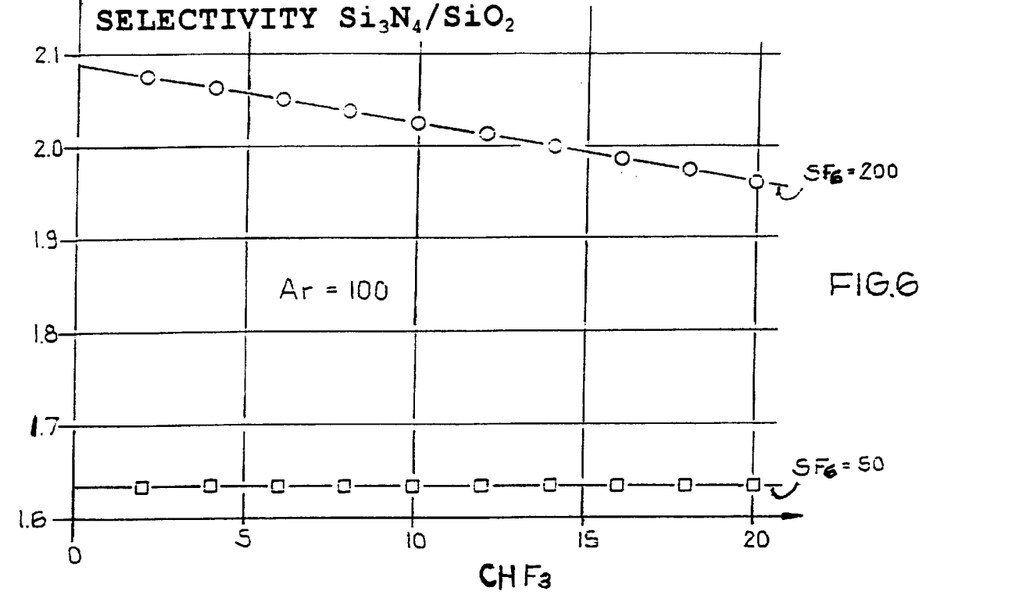
FIG. 6 is a graph showing the etching selectivity of silicon nitride relative to silicon oxide as a function of the gas flow rate of $CHF_3$, for a fixed argon flow rate of 100 sccm, and parametrically. showing the results for two different flow rates of $SF_6$.
Figure 7:
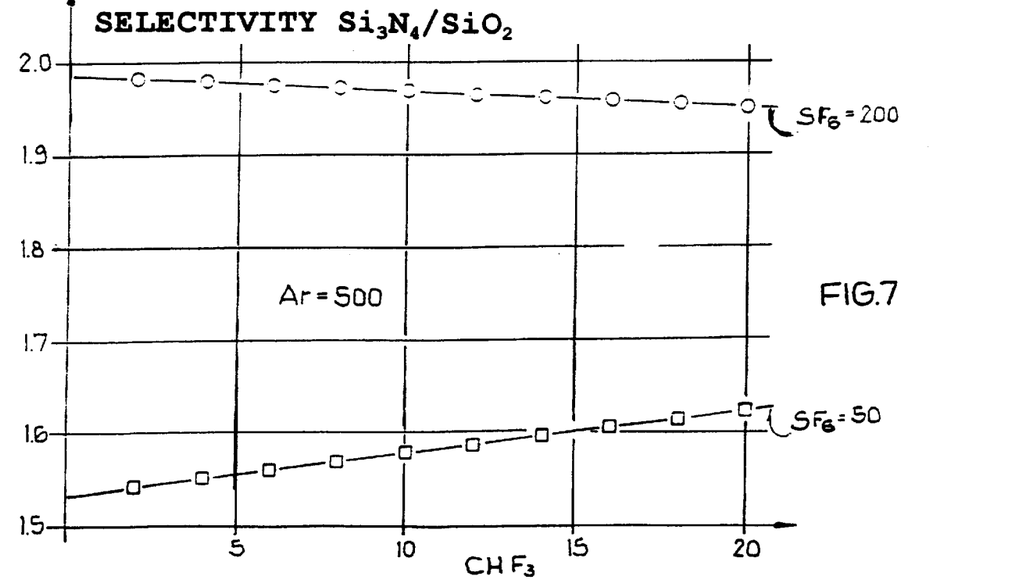
FIG. 7 is a graph similar to that of FIG. 6, but for an argon flow rate of 500 sccm.

FIGS. 6 and 7 illustrate the influence of the varying gas flow rates on the etching selectivity of the silicon nitride relative to the silicon oxide. For a relatively low argon flow rate of 100 sccm, and a relatively low $SF_6$ flow rate of 50 sccm, the selectivity remains constant at about 1.64 regardless of the variation of the $CHF_3$ flow rate in a range from 2 sccm to 20 sccm. On the other hand, as shown in FIG. 7, when the Ar flow rate is increased to 500 sccm, while maintaining the $SF_6$ flow rate at 50 sccm, then the selectivity will increase from about 1.54 to about 1.62 as the $CHF_3$ flow rate is increased from 2 to 20 sccm. Meanwhile, the selectivity decreases with increasing $CHF_3$ flow rate when using a higher $SF_6$ flow rate of 200 sccm. This is true both for the lower Ar flow rate of 100 sccm in FIG. 6 and for the higher Ar flow rate of 500 sccm in FIG. 7, but the decreasing trend is more strongly pronounced when the lower Ar flow rate is used. Overall, a proper selection of the respective gas flow rates can achieve a targeted etching selectivity in a range from 1.5 to 2.2, and especially high selectivities of at least 1.9 or at least 2.0.

From the results shown in present FIGS. 2 to 7 in connection with the above discussion, it is apparent that there is no simple or predictable relationship between the edge slope angle of the etched edges of the silicon nitride as a function of the gas flow rates, or of the etching selectivity as a function of the gas flow rates. Instead, it is necessary to select and fine tune the various flow rates in combination or interactively with each other, in order to achieve the desired edge slope angle and etching selectivity. Based on the present disclosure, it is now possible to achieve such an adjustment or selection of the desired resulting edge slope angle and etching selectivity responsive to the adjustment of process parameters.

Generally, the inventive dry etching process can be carried out with the basic process parameters in ranges as follows. The total gas pressure may be in a range from 200 to 500 mTorr, the plasma power in a range from 100 to 600 W, the Ar flow in a range from 100 to 700 sccm, the $SF_6$ flow in a range from 30 to 300 sccm, and the $CHF_3$ flow in a range from 1 to 50 sccm. The flow rates of the respective gases establish corresponding proportional contents of the respective gases in the gas mixture, and corresponding molar ratios of $CHF_3$ relative to $SF_6$. From the above discussion it is understood that the molar ratios of $CHF_3$ relative to $SF_6$ in the gas mixtures according to the invention preferably are less than 1, or even more preferably less an 0.3, whereby molar ratios significantly less than 0.3 are also suitable for particular applications, i.e. particular edge slope angles and etching selectivities to be achieved.

Values of the above parameters outside of the above specified ranges achieve worse results, or are unable to achieve the intended advantageous results as described herein. The present invention also includes every possible value for each of the parameters between the end points of each range set forth above, and as shown in the drawings, whereby the graphs of FIGS. 2 to 7 are drawn to scale and accurately represent the data within at least a portion of the scope of the inventive ranges.

The particular concrete selection of specific values of the several process parameters depends on the requirements of the particular individual application, and especially depends on the desired etching rate, edge slope angle, and etching selectivity, as demonstrated in the present drawings. The present inventive method is applicable to a broad range of fabrication processes involving the selective or differential etching of silicon nitride and silicon oxide. Due to the good process throughput achieved as a result of the high silicon nitride etching rate, and a very good etching uniformity, the process is practically and economically viable and suitable for commercial production.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of preparing a dry-etched semiconductor component, comprising the following steps:
   a) providing a semiconductor structure including a first semiconductor layer comprising $SiO_2$, and a second semiconductor layer comprising $Si_3N_4$ arranged on said first semiconductor layer;
   b) preparing an etching gas mixture containing $SF_6$, $CHF_3$ and a further non-oxidizing gas;
   c) establishing an environment of said etching gas mixture on at least one first surface portion of said second semiconductor layer comprising $Si_3N_4$ that is to be etched; and d) generating a plasma and anisotropically dry-etching said second semiconductor layer using said etching gas mixture commencing at said first surface portion and proceeding until reaching said first semiconductor layer so that said etching gas mixture contacts said first semiconductor layer without etching through said first semiconductor layer, so as to form said dry-etched semiconductor component;

wherein said dry-etching forms an etched edge along a remaining portion of said second semiconductor layer, wherein said etched edge extends at an edge slope angle defined as an angle through said remaining portion between said etched edge and a surface of said second semiconductor layer facing said first semiconductor layer, wherein said etching gas mixture containing $SF_6$, $CHF_3$ and a further non-oxidizing gas is used throughout said dry-etching from a beginning of said step d) to an end of said step d) at which said etching gas mixture contacts said first semiconductor layer, and wherein said dry-etching selectively etches said second semiconductor layer preferentially relative to said first semiconductor layer in accordance with an etching selectivity.

2. The method according to claim 1, wherein said first semiconductor layer essentially consists of said $Sio_2$ and said second semiconductor layer essentially consists of said $Si_3N_4$.

3. The method according to claim 1, wherein said step a) further comprises providing a resist layer on a second surface portion of said second semiconductor layer which is distinct from said at least one first surface portion and at which said second semiconductor layer is not to be etched, and wherein an edge of said resist layer defines the location of said etched edge.

4. The method according to claim 1, wherein said non-oxidizing gas comprises argon, and wherein said etching gas mixture contains no oxygen, no chlorine, no bromine, and no iodine.

5. The method according to claim 1, wherein said etching gas mixture contains no halide in addition to said $SF_6$ and said $CHF_3$.

6. The method according to claim 1, wherein said dry-etching of said step d) is continued until said dry-etching progresses entirely through a thickness of said second semiconductor layer at said first surface portion to reach said first semiconductor layer without etching through more than one half of a thickness of said first semiconductor layer so that at least one half of said thickness of said first semiconductor layer remains after completion of said dry-etching.

7. The method according to claim 6, wherein said dry-etching of said step d) is carried out for a total etching time including an over-etching time during which said dry-etching is continued after reaching said first semiconductor layer, wherein said over-etching time amounts to less than 10% of said total etching time.

8. The method according to claim 1, wherein said etching selectivity of etching said second semiconductor layer comprising $Si_3N_4$ relative to said first semiconductor layer comprising $SiO_2$ is at least 1.9.

9. The method according to claim 1, wherein said etching gas mixture consists essentially of said $SF_6$, said $CHF_3$, and said non-oxidizing gas, and wherein said step c) comprises flowing said $SF_6$ with a flow rate in a range from 30 to 300 sccm, flowing said $CHF_3$ with a flow rate in a range from 1 to 50 sccm, and flowing said non-oxidizing gas with a flow rate in a range from 100 to 700 sccm.

10. The method according to claim 1, further comprising before said step c) a preliminary step of specifying a target value of said edge slope angle, and a target value of said etching selectivity to be achieved by said dry-etching in said step d), wherein said step c) further comprises selecting respective proportional amounts of said $SF_6$, said $CHF_3$, and said non-oxidizing gas when establishing said environment, and wherein said dry-etching in said step d) achieves said target value of said edge slope angle and said target value of said etching selectivity responsive to and dependent on said respective proportional amounts of said $SF_6$ said $CHF_3$ and said non-oxidizing gas that were selected in said step c).

11. The method according to claim 10, wherein said non-oxidizing gas comprises a noble inert gas.

12. The method according to claim 11, wherein said noble inert gas comprises argon.

13. The method according to claim 12, wherein said step d) further comprises varying at least one process parameter of said dry-etching so as to adjust said edge slope angle and so as to adjust said etching selectivity responsive to and dependent on said varying.

14. The method according to claim 13, wherein said step c) is conducted to establish said environment with a gas pressure, said generating of said plasma in said step d) comprises applying a plasma generation power to electrodes that are spaced apart at an electrode spacing distance, and wherein said at least one process parameter is at least one of said gas pressure, said plasma generation power, and said electrode spacing distance.

15. The method according to claim 10, wherein said target value of said edge slope angle is in a range from 75° to 95°, said target value of said etching selectivity is in a range from 1.5 to 2.2, said proportional amount of said $SF_6$ comprises a flow rate of said $SF_6$ in a range from 50 to 300 sccm, said proportional amount of said $CHF_3$ comprises a flow rate of said $CHF_3$ in a range from 1 to 20 sccm, and said proportional amount of said non-oxidizing gas comprises a flow rate of said non-oxidizing gas in a range from 100 to 700 sccm.

16. The method according to claim 1, wherein said non-oxidizing gas is argon, wherein said steps b) and c) are carried out by providing a flow of said $SF_6$ at a flow rate of 200 sccm, providing a flow of said $CHF_3$ at a flow rate of 7 sccm, and providing a flow of said argon at a flow rate of 500 sccm, and wherein said edge slope angle is 90° and said etching selectivity is 1.9 in said step d).

17. The method according to claim 1, wherein said second semiconductor layer has a thickness of at least 400 nm.

18. The method according to claim 1, wherein said steps b), c) and d) are carried out such that said etching selectivity increases responsively as a proportional content of said $CHF_3$ in said etching gas mixture is increased.

19. The method according to claim 1, wherein said step b) is carried out so that a molar ratio of said $CHF_3$ relative to said $SF_6$ in said etching gas mixture is less than 1.

20. The method according to claim 19, wherein said molar ratio is less than 0.3.

21. The method according to claim 1, wherein said non-oxidizing gas is argon, and wherein said steps b) and c) are carried out by providing a flow of said $SF_6$ at a flow rate in a range from 30 to 300 sccm, providing a flow of said $CHF_3$ at a flow rate in a range from 1 to 50 sccm, and providing a flow of said argon at a flow rate in a range from 100 to 700 sccm.

22. The method according to claim 1, further comprising a preliminary step of providing a reactor chamber that is equipped with oxidizable electrodes, and wherein said step c) comprises establishing said environment of said etching gas mixture in said reactor chamber in contact with said electrodes.

23. The method according to claim 1, wherein said non-oxidizing gas is argon and said etching gas mixture excludes helium.

24. The method according to claim 23, wherein said argon affects said dry-etching of said second semiconductor layer.

25. The method according to claim 1, wherein said etching gas mixture does not include bromine, does not include chlorine, and does not include oxygen at any time during said dry-etching of said second semiconductor layer.

26. A method of preparing a dry-etched semiconductor component, comprising the following steps:
 a) providing a semiconductor structure including a first semiconductor layer comprising $SiO_2$, and a second semiconductor layer comprising $Si_3N_4$ arranged on said first semiconductor layer;
 b) preparing an etching gas mixture containing $SF_6$, $CHF_3$ and argon;
 c) establishing an environment of said etching gas mixture on at least one first surface portion of said second semiconductor layer comprising $Si_3N_4$ that is to be etched; and
 d) generating a plasma and anisotropically dry-etching said second semiconductor layer using said etching gas mixture commencing at said first surface portion and proceeding until reaching said first semiconductor layer so that said etching gas mixture contacts said first semiconductor layer without etching through said first semiconductor layer, so as to form said dry-etched semiconductor component;
 wherein said dry-etching forms an etched edge along a remaining portion of said second semiconductor layer,
 wherein said etched edge extends at an edge slope angle defined as an angle through said remaining portion between said etched edge and a surface of said second semiconductor layer facing said first semiconductor layer,
 wherein said argon influences said dry-etching of said second semiconductor layer,
 wherein said etching gas mixture does not include bromine, does not include chlorine and does not include oxygen at any time during said dry-etching of said second semiconductor layer, and
 wherein said dry-etching selectively etches said second semiconductor layer preferentially relative to said first semiconductor layer in accordance with an etching selectivity.

27. The method according to claim 1, wherein said etching selectivity of etching said second semiconductor layer comprising $Si_3N_4$ relative to said first semiconductor layer comprising $SiO_2$ is at least 1.5.

28. The method according to claim 1, wherein said etching selectivity of etching said second semiconductor layer comprising $Si_3N_4$ relative to said first semiconductor layer comprising $SiO_2$ is at least 1.7.

29. The method according to claim 26, wherein said etching selectivity of etching said second semiconductor layer comprising $Si_3N_4$ relative to said first semiconductor layer comprising $SiO_2$ is at least 1.5.

30. The method according to claim 26, wherein said step b) is carried out so that a molar ratio of said $CHF_3$ relative to said $SF_6$ in said etching gas mixture is less than 1.

* * * * *

UNITED STATES PATENT AND TRADEMARK OFFICE
CERTIFICATE OF CORRECTION

PATENT NO. : 6,569,773 B1 Page 1 of 1
DATED : May 27, 2003
INVENTOR(S) : Gellrich et al.

It is certified that error appears in the above-identified patent and that said Letters Patent is hereby corrected as shown below:

Title page,
Item [56], References Cited, U.S. PATENT DOCUMENTS, delete the duplicate reference of "4,844,733 A  7/1989...".

Column 4,
Line 66, after "parametrically", delete ".".

Column 9,
Line 26, after "said", replace "$Sio_2$" by -- $SiO_2$ --;
Line 44, after "continued", replace "until said dry-etching" by -- after reaching --;
Line 45, delete the entire line;
Line 46, before "said", (second occurrence), delete "conductor layer at said first surface portion to reach".

Signed and Sealed this

Thirtieth Day of September, 2003

JAMES E. ROGAN
*Director of the United States Patent and Trademark Office*